United States Patent
Lee et al.

(10) Patent No.: US 12,471,292 B2
(45) Date of Patent: Nov. 11, 2025

(54) PHASE-CHANGE MEMORY STRUCTURE AND PHASE-CHANGE MEMORY DEVICE INCLUDING THE SAME

(71) Applicant: Samsung Electronics Co., Ltd., Suwon-si (KR)

(72) Inventors: Changseung Lee, Suwon-si (KR); Kiyeon Yang, Suwon-si (KR); Youngjae Kang, Suwon-si (KR); Hajun Sung, Suwon-si (KR); Dongho Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 333 days.

(21) Appl. No.: 18/298,642

(22) Filed: Apr. 11, 2023

(65) Prior Publication Data

US 2024/0107778 A1    Mar. 28, 2024

(30) Foreign Application Priority Data

Sep. 27, 2022   (KR) .......................... 10-2022-0122871

(51) Int. Cl.
  *H10B 63/10*    (2023.01)
  *H10B 63/00*    (2023.01)

(52) U.S. Cl.
  CPC .............. *H10B 63/10* (2023.02); *H10B 63/80* (2023.02)

(58) Field of Classification Search
  CPC .............................. H10D 30/029; H10B 63/10
  See application file for complete search history.

(56) References Cited

U.S. PATENT DOCUMENTS

| | | |
|---|---|---|
| 7,638,789 B2 | 12/2009 | Peters |
| 7,719,886 B2 | 5/2010 | Philipp et al. |
| 7,864,567 B2 | 1/2011 | Gordon et al. |
| 7,910,904 B2 | 3/2011 | Kuo et al. |
| 8,295,080 B2 | 10/2012 | Aizawa et al. |
| 9,337,421 B2 | 5/2016 | Chin et al. |
| 9,379,321 B1 | 6/2016 | Chang et al. |

(Continued)

FOREIGN PATENT DOCUMENTS

| | | |
|---|---|---|
| CN | 102117885 A | 7/2011 |
| JP | 2010-287744 A | 12/2010 |

(Continued)

OTHER PUBLICATIONS

N. Gong et al., "A no-verification Multi-Level-Cell (MLC) operation in Cross-Point OTS-PCM", Symposium on VLSI Technology, 2020.

Simone Raoux et al., "Crystallization properties of ultrathin phase change films", Journal of Applied Physics, vol. 103, No. 114310, 2008.

Keyuan Ding et al., "Phase-change heterostructure enables ultralow noise and drift for memory operation", Phase-Change Memory, Science, vol. 366, No. 6462, pp. 210-215, Oct. 11, 2019.

(Continued)

*Primary Examiner* — Mounir S Amer
(74) *Attorney, Agent, or Firm* — Harness, Dickey & Pierce, P.L.C.

(57) ABSTRACT

A phase-change memory structure includes lower and upper electrodes spaced apart from each other, and a phase-change material stack between the lower and upper electrodes. The phase-change material stack includes a plurality of phase-change layers, at least two phase-change layers of the plurality of phase-change layers have different phase-change temperatures, and a plurality of barrier layers between the plurality of phase-change layers The at least two phase-change layers of the plurality of phase-change layers have different thicknesses.

20 Claims, 15 Drawing Sheets

(56) References Cited

U.S. PATENT DOCUMENTS

| | | |
|---|---|---|
| 9,543,510 B2 | 1/2017 | Miao et al. |
| 9,704,921 B2 | 7/2017 | Kim et al. |
| 9,748,311 B2 | 8/2017 | Fantini et al. |
| 10,062,840 B2 | 8/2018 | Sim et al. |
| 10,084,017 B2 | 9/2018 | Ohba et al. |
| 10,163,977 B1 | 12/2018 | Fantini et al. |
| 10,186,552 B2 | 1/2019 | Choi et al. |
| 10,374,009 B1 | 8/2019 | Cheng et al. |
| 11,538,988 B2 * | 12/2022 | Sarkar .................... H10B 63/80 |
| 2003/0080427 A1 | 5/2003 | Hudgens et al. |
| 2005/0051901 A1 | 3/2005 | Chen |
| 2009/0268506 A1 | 10/2009 | Seigler et al. |
| 2013/0292631 A1 | 11/2013 | Chin et al. |
| 2013/0306929 A1 | 11/2013 | Lee et al. |
| 2017/0237000 A1 | 8/2017 | Terai et al. |
| 2018/0205017 A1 * | 7/2018 | Bruce .................... H10B 63/84 |
| 2019/0148456 A1 | 5/2019 | Wu et al. |
| 2023/0371405 A1 * | 11/2023 | Brew .................... H10N 70/231 |

FOREIGN PATENT DOCUMENTS

| | | |
|---|---|---|
| KR | 10-2013-0124893 A | 11/2013 |
| WO | 2012/079296 A1 | 6/2012 |

OTHER PUBLICATIONS

M. Kinoshita et al., "Scalable 3-D vertical chain-cell-type phase-change memory with 4F2 poly-Si diodes", Symposium on VLSI Technology Digest of Technical Papers, 2012.

K. Kurotsuchi et al., "2.8-GB/s-write and 670-MB/s-erase operations of a 3D vertical chain-cell-type phase-change memory array", Symposium on VLSI Technology Digest of Technical papers, 2015.

Nishant Saxena et al., "Exploring ultrafast threshold switching in In3SbTe2 phase change memory devices", Scientific Reports, vol. 9, No. 19251, 2019.

* cited by examiner

PHASE-CHANGE MEMORY STRUCTURE AND PHASE-CHANGE MEMORY DEVICE INCLUDING THE SAME

CROSS-REFERENCE TO RELATED APPLICATION

This application is based on and claims priority under 35 U.S.C. § 119 to Korean Patent Application No. 10-2022-0122871, filed on Sep. 27, 2022, in the Korean Intellectual Property Office, the disclosure of which is incorporated by reference herein in its entirety.

BACKGROUND

1. Field

The inventive concepts relate to phase-change memory structures and phase-change memory devices including the phase-change memory structures.

2. Description of the Related Art

In recent years, small and high-performance electronic devices have been developed, and along with this, memory devices capable of storing information are required in various electronic devices such as computers and portable communication devices. An example of such memory devices is a phase-change memory device such as a phase-change random access memory (PRAM), which is capable of storing data by using the phase of a material that varies according to a temperature applied thereto.

SUMMARY

Some example embodiments of the inventive concepts provide a phase-change memory structure and a phase-change memory device including the phase-change memory structure. The phase-change memory structure and phase-change memory device including same may be configured to support multi-bit operations.

Some example embodiments will be set forth in part in the description which follows and, in part, will be apparent from the description, or may be learned by practice of example embodiments of the inventive concepts.

According to some example embodiments of the inventive concepts, a phase-change memory structure may include a lower electrode and an upper electrode, which are spaced apart from each other, and a phase-change material stack between the lower electrode and the upper electrode and including a plurality of phase-change layers, at least two phase-change layers of the plurality of phase-change layers having different phase-change temperatures, and a plurality of a barrier layers between the plurality of phase-change layers, wherein the at least two phase-change layers of the plurality of phase-change layers have different thicknesses.

A contact area between the lower electrode and the phase-change material stack may be identical in size to a contact area between the upper electrode and the phase-change material stack.

At least one of the plurality of phase-change layers may have a thickness of about 0.01 nm to about 10 nm.

Each of the plurality of phase-change layers may include a multi-component chalcogenide material having a crystallization temperature of about 100 degrees Celsius to about 3000 degrees Celsius.

Each barrier layer of the plurality of barrier layers may include a non-oxide material having a thermal conductivity of about 0.001 W/mK to about 1 W/mK.

The plurality of phase-change layers may be vertically symmetrical with respect to a central portion of the phase-change material stack.

Respective phase-change temperatures of the plurality of phase-change layers may be proportional to respective distances of the plurality of phase-change layers from the central portion of the phase-change material stack.

The respective phase-change temperatures of the plurality of phase-change layers may be respective crystallization temperatures of the plurality of phase-change layers. Respective thicknesses of the plurality of phase-change layers may be inversely proportional to the respective distances of the phase-change layers from the central portion of the phase-change material stack.

A plurality of phase-change layers which are the thinnest among the plurality of phase-change layers may be arranged in each of an upper portion and a lower portion of the phase-change material stack.

Thermal conductivity of each phase-change layer of the plurality of phase-change layers may be equal to or greater than a thermal conductivity of each barrier layer of the plurality of barrier layers.

The phase-change memory structure may be configured to implement a multi-bit operation based on crystallization of each of the plurality of phase-change layers.

The respective phase-change temperatures of the plurality of phase-change layers may be respective melting temperatures of the plurality of phase-change layers, and respective thicknesses of the plurality of phase-change layers may be proportional to the respective distances of the plurality of phase-change layers from the central portion of the phase-change material stack.

A plurality of phase-change layers which are the thinnest among the plurality of phase-change layers may be arranged in the central portion of the phase-change material stack.

Thermal conductivity of each phase-change layer of the plurality of phase-change layers may be greater than or equal to a thermal conductivity of each barrier layer of the plurality of barrier layers.

The phase-change memory structure may be configured to implement a multi-bit operation based on amorphization of each of the plurality of phase-change layers.

According to some example embodiments of the inventive concepts, a phase-change memory device may include a plurality of memory cells, wherein each of the memory cells includes a phase-change memory structure and a selector, which are connected in series to each other, wherein the phase-change memory structure includes a lower electrode and an upper electrode, which are spaced apart from each other, and a phase-change material stack between the lower electrode and the upper electrode and including a plurality of phase-change layers, at least two phase-change layers of the plurality of phase-change layers having different phase-change temperatures, and a plurality of a barrier layers between the plurality of phase-change layers, wherein the at least two phase-change layers of the plurality of phase-change layers have different thicknesses.

The phase-change memory device may have a three-dimensional cross-point structure.

A contact area between the lower electrode and the phase-change material stack may be identical in size to a contact area between the upper electrode and the phase-change material stack, and at least one of the plurality of phase-change layers may have a thickness of 10 nm or less.

The plurality of phase-change layers may be vertically symmetrical with respect to a central portion of the phase-change material stack, and respective phase-change temperatures of the plurality of phase-change layers may be proportional to respective distances of the plurality of phase-change layers from the central portion of the phase-change material stack.

The respective phase-change temperatures of the plurality of phase-change layers may be crystallization temperatures of the plurality of phase-change layers, and respective thicknesses of the plurality of phase-change layers may be inversely proportional to the respective distances of the phase-change layers from the central portion of the phase-change material stack.

The respective phase-change temperatures of the plurality of phase-change layers may be melting temperatures of the plurality of phase-change layers, and respective thicknesses of the plurality of phase-change layers may be proportional to the respective distances of the plurality of phase-change layers from the central portion of the phase-change material stack.

According to some example embodiments of the inventive concepts, an electronic device includes the phase-change memory device.

BRIEF DESCRIPTION OF THE DRAWINGS

The above and other aspects, features, and advantages of some example embodiments of the inventive concepts will be more apparent from the following description taken in conjunction with the accompanying drawings, in which.

DETAILED DESCRIPTION

Figure 1:
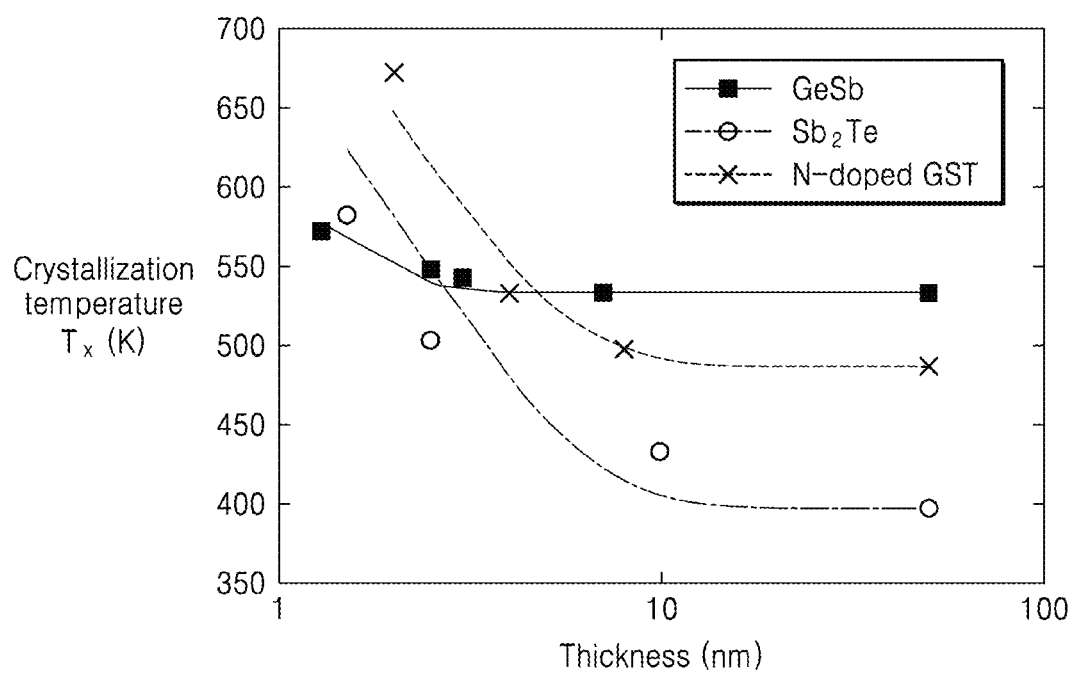
FIG. 1 illustrates crystallization temperatures of chalcogenide-based phase-change materials with respect to thicknesses of the chalcogenide-based phase-change materials, which were measured by X-ray diffraction (XRD) analysis.

Reference will now be made in detail to example embodiments, some of which are illustrated in the accompanying drawings, wherein like reference numerals refer to like elements throughout. In this regard, the present embodiments may have different forms and should not be construed as being limited to the descriptions set forth herein. Accordingly, some example embodiments are merely described below, by referring to the figures, to explain aspects. Expressions such as "at least one of," when preceding a list of elements, modify the entire list of elements and do not modify the individual elements of the list.

Hereinafter, some example embodiments will be described with reference to the accompanying drawings. In the drawings, like reference numerals refer to like elements, and the sizes of elements may be exaggerated for clarity of illustration. Some example embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative determiner may be construed as the element or the elements even though it has a singular form. Operations of a method may be performed in an appropriate order unless explicitly described in terms of order or described to the contrary, and are not limited to the stated order thereof.

In the inventive concepts, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Examples or example terms are just used herein to describe technical ideas and should not be considered for purposes of limitation unless defined by the claims.

A phase-change memory device (PRAM) refers to a memory device configured to store data using the phase of a phase-change material (PCM), which varies according to temperatures. The phase of a phase-change material varies rapidly and reversibly between an "amorphous state" and a "crystalline state," and data may be stored in a phase-change material through, for example, a multi-bit operation, that is, a two-or-more-bit operation, by using a high resistance value at the amorphous state and a low resistance value at the crystalline state. A chalcogenide material may be used as a phase-change material, and for example, a ternary chalcogenide material, $Ge_2Sb_2Te_5$ (GST), is widely used.

In the related art, a method of forming a resistance difference by controlling the ratio of a crystalline-state volume and an amorphous-state volume of a phase-change material has been used to implement a multi-bit operation. However, the reproducibility of the amorphous-state volume deteriorates with repeated writings, and resistance at the amorphous state varies with time. Thus, it may be difficult to use this method for memory devices implementing a multi-bit operation.

FIG. 1 illustrates the crystallization temperatures $T_x$ of chalcogenide-based phase-change materials with respect to the thicknesses of the chalcogenide-based phase-change materials, which were measured by X-ray diffraction (XRD) analysis. In FIG. 1, GeSb, $Sb_2Te$, and N-doped GST were used as the phase-change materials. FIG. 1 shows that when the thicknesses of the phase-change materials are about 10 nm or less, the crystallization temperatures $T_x$ of the phase-change materials gradually increase as the thicknesses of the phase-change materials decrease.

Figure 2:
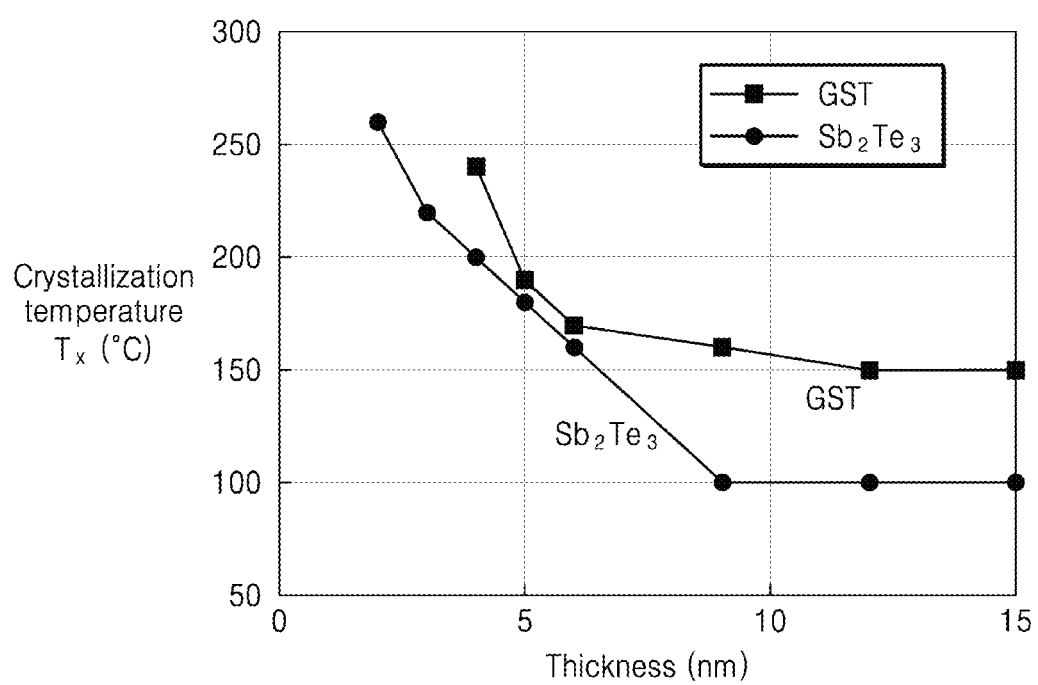
FIG. 2 illustrates crystallization temperatures of chalcogenide-based phase-change materials with respect to thicknesses of the chalcogenide-based phase-change materials, which were measured by Raman analysis, according to some example embodiments.

FIG. 2 illustrates the crystallization temperatures $T_x$ of chalcogenide-based phase-change materials with respect to the thicknesses of the chalcogenide-based phase-change materials, which were measured by Raman analysis, according to some example embodiments. In FIG. 2, GST and $Sb_2Te_3$ were used as the phase-change materials. FIG. 2 shows that when the thicknesses of the phase-change materials are about 10 nm or less, the crystallization temperatures $T_x$ of the phase-change materials gradually increase as the thicknesses of the phase-change materials decrease.

Figure 3:
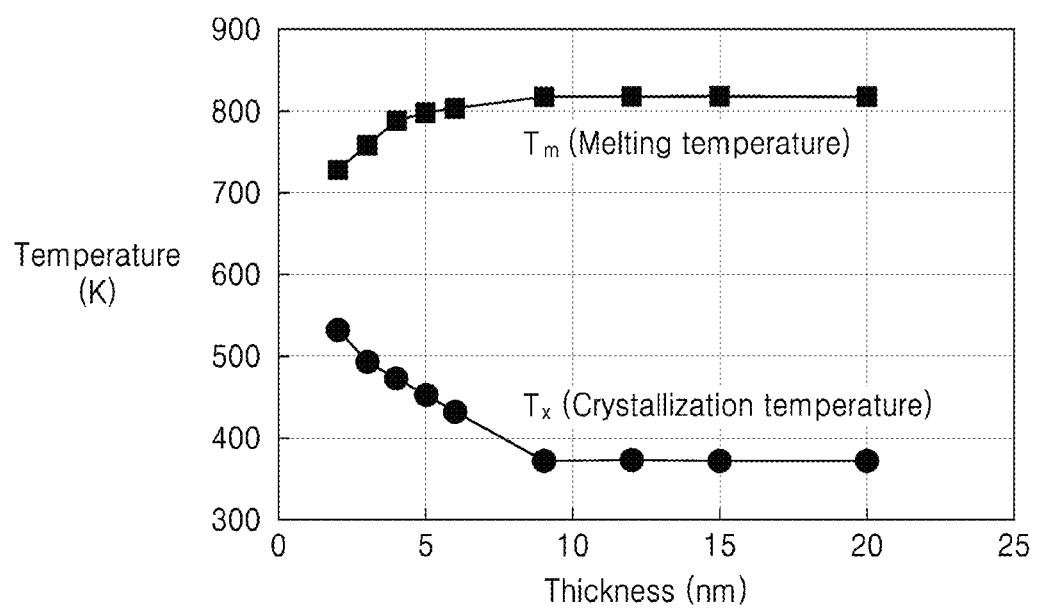
FIG. 3 illustrates crystallization temperatures and melting temperatures of chalcogenide-based phase-change materials with respect to thicknesses of the chalcogenide-based phase-change materials, which were measured by simulation, according to some example embodiments.

FIG. 3 illustrates the crystallization temperatures $T_x$ and the melting temperatures $T_m$ of chalcogenide-based phase-change materials with respect to the thicknesses of the chalcogenide-based phase-change materials, which were measured by simulation, according to some example embodiments. FIG. 3 shows simulation results measured using GST and $Sb_2Te_3$ as the phase-change materials. FIG. 3 shows that when the thicknesses of the phase-change materials are about 10 nm or less, the crystallization temperatures $T_x$ gradually increase and the melting temperatures $T_m$ gradually decrease as the thicknesses of the phase-change materials decrease.

In some example embodiments described below, a multi-bit operation is implemented by forming a phase-change material stack having a multi-layer structure, and using a phenomenon in which the phase-change temperature (for example, a crystallization temperature or a melting temperature) of a phase-change material varies according to the thickness of the phase-change material.

Figure 4:
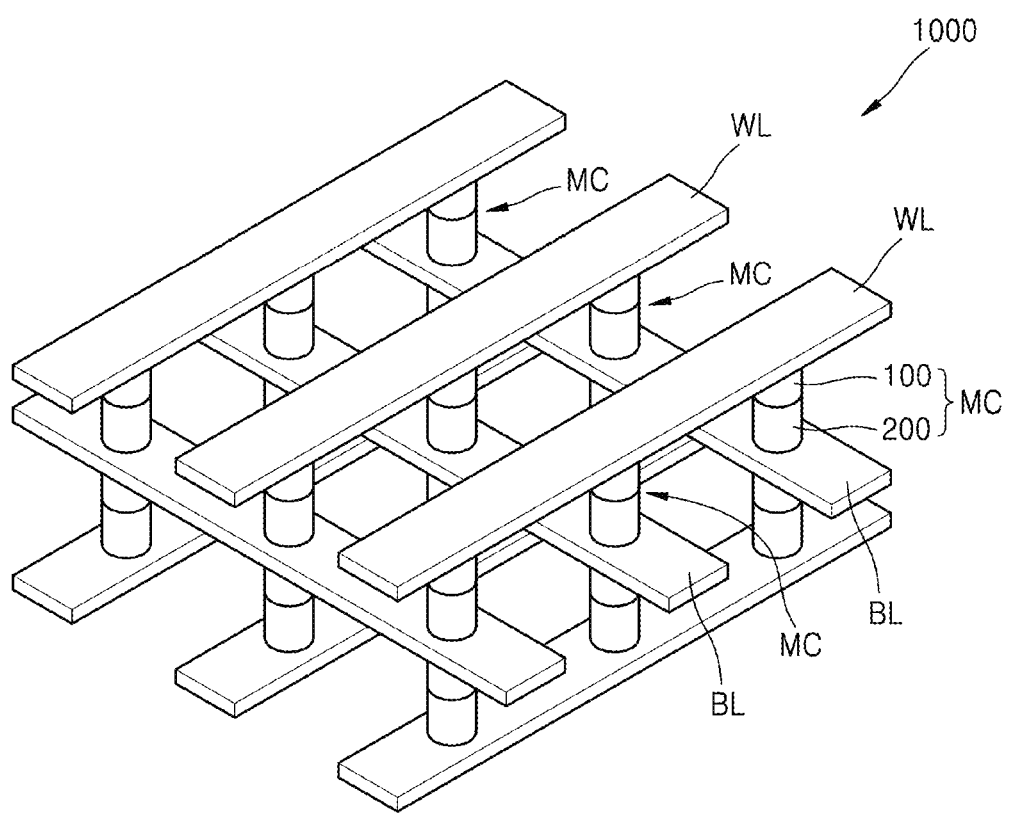
FIG. 4 is a perspective view illustrating a phase-change memory device according to some example embodiments.

FIG. 4 is a perspective view illustrating a phase-change memory device 1000 according to some example embodiments.

Referring to FIG. 4, the phase-change memory device 1000 may have a three-dimensional cross-point structure. Referring to FIG. 4, a plurality of memory cells MC are provided at cross points between a plurality of bit lines BL extending in an x-axis direction and a plurality of word lines WL extending in a y-axis direction.

Each of the memory cells MC includes a selector 200 and a phase-change memory structure 100, which are connected in series with each other. The selector 200 may prevent the occurrence of a sneak current in the memory cell MC and may thus allow the selection of the memory cell MC. The selector 200 may include, for example, an ovonic threshold switch device, which uses a chalcogenide-based material. However, example embodiments are not limited thereto. In the phase-change memory device 1000, the selectors 200 may be electrically connected to the bit lines BL, and the phase-change memory structures 100 may be electrically connected to the word lines WL.

Figure 5:
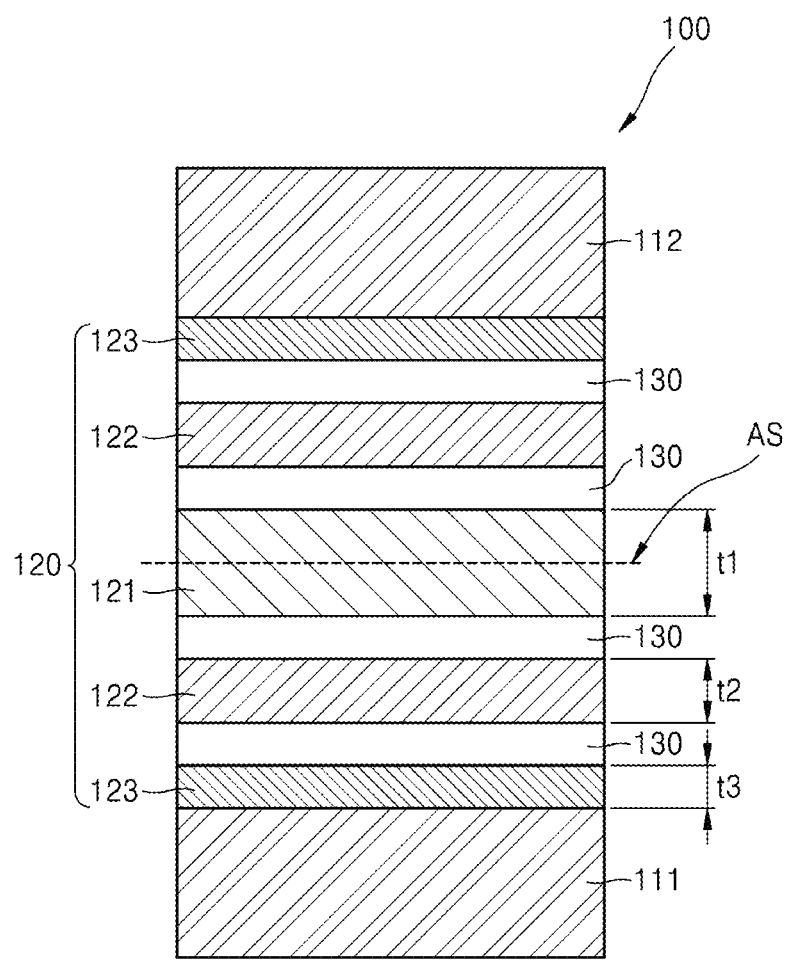
FIG. 5 is a cross-sectional view illustrating an example of a phase-change memory structure of the phase-change memory device of FIG. 4, according to some example embodiments.

FIG. 5 is a cross-sectional view illustrating an example of the phase-change memory structures 100 of the phase-change memory device 1000 of FIG. 4, according to some example embodiments.

Referring to FIG. 5, the phase-change memory structure 100 includes a lower electrode 111, an upper electrode 112, and a phase-change material stack 120 provided between the lower electrode 111 and the upper electrode 112. For example, the lower electrode 111 and the upper electrode 112 may be referred to as being spaced apart (e.g., isolated from direct contact with) each other with the phase-change material stack 120 therebetween. Here, the lower electrode 111 and the upper electrode 112 may be in contact with the phase-change material stack 120 with the same contact area. For example, a contact area (e.g., an area of a contact interface) between the lower electrode 111 and the phase-change material stack 120 is identical (e.g., identical in size) to a contact area (e.g., an area of a contact interface) between the upper electrode 112 and the phase-change material stack 120.

The lower and upper electrodes 111 and 112 may each include a conductive material. For example, the conductive material may include a metal, a conductive metal oxide, a conductive metal nitride, or any combination thereof. For example, the conductive material may include one of carbon (C), titanium nitride (TiN), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), or tungsten nitride (WN). In addition, the conductive material may include, for example, at least one of tantalum silicon nitride (TaSiN), tantalum aluminum nitride (TaAlN), tungsten silicide (WSi), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), titanium aluminum (TiAl), titanium oxynitride (TiON), titanium aluminum oxynitride (TiAlON), tungsten oxynitride (WON), tantalum oxynitride (TaON), silicon carbide (SiC), silicon carbon nitride (SiCN), carbon nitride (CN), tantalum carbon nitride (TaCN), or any combination thereof. However, the conductive material is not limited thereto.

The phase-change material stack 120 having a multi-layer structure is disposed between the lower electrode 111 and the upper electrode 112. The phase-change material stack 120 may include a plurality of phase-change layers 121, 122, and 123, and each of the plurality of phase-change layers 121, 122, and 123 may include a phase-change material of which the phase changes according to temperatures. In some example embodiments, at least two phase-change layers of the plurality of phase-change layers 121, 122, and 123 may have different phase-change temperatures.

Each of the plurality of phase-change layers 121, 122, and 123 may include a multi-component chalcogenide material having a crystallization temperature of about 100 degrees Celsius or higher. For example, each of the plurality of phase-change layers 121, 122, and 123 may include a multi-component chalcogenide material having a crystallization temperature of about 100 degrees Celsius to about 3000 degrees Celsius, about 100 degrees Celsius to about 700 degrees Celsius, about 100 degrees Celsius to about 650 degrees Celsius, about 100 degrees Celsius to about 600 degrees Celsius, about 100 degrees Celsius to about 550 degrees Celsius, about 100 degrees Celsius to about 500 degrees Celsius, about 100 degrees Celsius to about 450 degrees Celsius, about 100 degrees Celsius to about 400 degrees Celsius, about 100 degrees Celsius to about 300 degrees Celsius, about 100 degrees Celsius to about 250 degrees Celsius, or the like. Here, the plurality of phase-change layers 121, 122, and 123 may include the same chalcogenide material.

For example, the plurality of phase-change layers 121, 122, and 123 may include: at least one of Sb or Te; and at least one of Ge, Se, In, Al, Ti, Sc, Sr, Ga, Ag, Ca, P, or S. However, the plurality of phase-change layers 121, 122, and 123 are not limited thereto. In addition, the plurality of phase-change layers 121, 122, and 123 may further include, for example, a dopant material such as C, B, N, and O.

Barrier layers 130 may be provided between the plurality of phase-change layers 121, 122, and 123. For example, as shown, the phase-change material stack 120 may include a barrier layer 130 between adjacent phase-change layers (e.g., phase-change layers 121 and 122, phase-change layers 122 and 123, etc.). The barrier layers 130 may function as thermal confinement layers. For example, the barrier layers 130 may block heat dissipation and localize heating, thereby accelerating the phase change of the phase-change material of each of the plurality of phase-change layers 121, 122, and 123. The barrier layers 130 may include an electrically conductive material having low thermal conductivity. For example, the barrier layers 130 may include a non-oxide material having a thermal conductivity of about 1 W/mK or less (e.g., about 0.001 W/mK to about 1 W/mK, about 0.01 W/mK to about 1 W/mK, about 0.1 W/mK to about 1 W/mK, about 0.5 W/mK to about 1 W/mK, or the like). For example, the barrier layers 130 may include a thermal confinement material such as $TiSe_2$, $TiS_2$, $ZrTe_2$, $ZrSe_2$, $HfTe_2$, $HfSe_2$, $TaTe_2$, $HfSe_2$, or $HfS_2$. These materials are merely examples. The barrier layers 130 may each have a thickness of about 1 nm to about 10 nm. However, the barrier layers 130 are not limited thereto.

The barrier layers 130 provided between the phase-change layers 121, 122, and 123 may have the same thickness, but may have different thickness to adjust the temperature gradient in the phase-change material stack 120. Also, the barrier layers 130 may include heterogeneous barrier layers having different thermal conductivities. This is the same also below.

The plurality of phase-change layers 121, 122, and 123 of the phase-change material stack 120 may be vertically symmetrical with respect to a central portion of the phase-change material stack 120. For example, the plurality of phase-change layers 121, 122, and 123 of the phase-change material stack 120 may have mirror symmetry or reflection symmetry around an axis of symmetry AS that may extend through a central portion of the phase-change material stack 120 that may be located, for example, within the phase-change layer 121, in a vertical direction extending through the plurality of phase-change layers 121, 122, 123 and barrier layers 130 of the phase-change material stack 120 and perpendicular to interfaces therebetween. FIG. 5 illustrates an example in which: a first phase-change layer 121 is disposed in the central portion of the phase-change material stack 120; second phase-change layers 122 are arranged above and below the first phase-change layer 121 such that the second phase-change layers 122 may be symmetrical with respect to the first phase-change layer 121; and third phase-change layers 123 are arranged above and below the second phase-change layers 122 such that the third phase-change layers 123 are symmetrical with respect to the first phase-change layer 121.

The plurality of phase-change layers 121, 122, and 123 may have different thicknesses (e.g., different thicknesses in the vertical direction that extends through each of the phase-change layers 121, 122, and 123). At least one of the plurality of phase-change layers 121, 122, or 123 may have a thickness of about 10 nm or less (for example, about 5 nm or less, about 1 nm to about 5 nm, about 0.1 nm to about 5 nm, about 0.01 nm to about 5 nm, about 1 nm to about 10 nm, about 0.1 nm to about 10 nm, about 0.01 nm to about 10 nm, or the like). As described above, the crystallization temperature of a chalcogenide-based phase-change material may vary as the thickness of the chalcogenide-based phase-change material varies within a thickness range of about 10 nm or less. Therefore, when the plurality of phase-change layers 121, 122, and 123 have different thicknesses, the plurality of phase-change layers 121, 122, and 123 may have different crystallization temperatures (e.g., different phase-change temperatures).

One of the plurality of phase-change layers 121, 122, or 123, which has the lowest crystallization temperature, may be disposed in a region to be heated to the highest temperature among regions of the phase-change material stack 120 to be heated by applying a current through the lower and upper electrodes 111 and 112. However, example embodiments are not limited thereto.

When the thermal conductivity of the phase-change layers 121, 122, and 123 and the thermal conductivity of the barrier layers 130 are substantially the same, the central portion of the phase-change material stack 120 may have the highest temperature of the entirety of the phase-change material stack 120. In this case, the first phase-change layer 121 having the lowest crystallization temperature among the plurality of phase-change layers 121, 122 and 123 may be disposed in the central portion of the phase-change material stack 120, and the third phase-change layers 123 having the highest crystallization temperature among the plurality of phase-change layers 121, 122, and 123 may be arranged in outer portions of the phase-change material stack 120.

The crystallization temperature of a chalcogenide-based phase-change material may increase as the thickness of the chalcogenide-based phase-change material gradually decreases within a range of about 10 nm or less (e.g., about 1 nm to about 10 nm). For example, the crystallization temperature of the chalcogenide-based phase-change material may be inversely proportional to the thickness of the chalcogenide-based phase-change material. Therefore, the plurality of phase-change layers 121, 122, and 123 may be arranged such that the thicknesses of the plurality of phase-change layers 121, 122, and 123 may gradually increase and the crystallization temperatures of the plurality of phase-change layers 121, 122, and 123 may gradually decrease in a direction toward the central portion of the phase-change material stack 120. For example, respective thicknesses of the phase-change layers 121, 122, and 123 may be inversely proportional to the respective distances of the phase-change layers 121, 122, and 123 from the central portion of the phase-change material stack 120. For example, thinner phase-change layers of the phase-change layers 121, 122, and 123 may be the furthest phase-change layers of the phase-change layers 121, 122, and 123 from the central portion of the phase-change material stack 120. Respective phase-change temperatures, for example crystallization temperatures, of the phase-change layers 121, 122, and 123 may be proportional (e.g., directly proportional according to a fixed coefficient of proportionality such as 0.1, 0.5, 1, 1.5, etc.) to respective distances of the phase-change layers 121, 122, and 123 from the central portion of the phase-change material stack 120. Here, the thinnest phase-change layer of the plurality of phase-change layers 121, 122, and 123 may have a thickness of about 10 nm or less (for example, about 5 nm or less, about 1 nm to about 5 nm, or the like).

The first phase-change layer 121, which is the thickest among the plurality of phase-change layers 121, 122, and 123, may be disposed in the central portion of the phase-change material stack 120 (e.g., closest to the central portion among the plurality of phase-change layers 121, 122, and 123), and the third phase-change layers 123, which are the thinnest among the plurality of phase-change layers 121, 122, and 123, may be disposed in the outer portions of the phase-change material stack 120 (e.g., furthest from the central portion among the plurality of phase-change layers 121, 122, and 123). The third phase-change layers 123 may have a thickness of about 10 nm or less (for example, about 5 nm or less, about 1 nm to about 5 nm). The first phase-change layer 121 may have a thickness of about 10 nm or more (e.g., about 10 nm to about 30 nm) or a thickness of 10 nm or less (e.g., about 1 nm to about 10 nm).

FIG. 5 illustrates an example in which: the first phase-change layer 121 disposed in the central portion of the phase-change material stack 120 has a first thickness t1 (e.g., in the vertical direction as shown) and a first crystallization temperature $T_{x1}$; the second phase-change layers 122 respectively provided above and below the first phase-change layer 121 have a second thickness t2 smaller than the first thickness t1 (t2<t1) and a second crystallization temperature $T_{x2}$ higher (e.g., greater) than the first crystallization temperature $T_{x1}$ ($T_{x2}>T_{x1}$); and the third phase-change layers 123 provided respectively above and below the second phase-change layers 122 have a third thickness t3 smaller than the second thickness t2 (t3<t2) and a third crystallization temperature $T_{x3}$ higher than the second crystallization temperature $T_{x2}$ ($T_{x3}>T_{x2}$).

In the above description, the case in which the thermal conductivity of the phase-change layers 121, 122, and 123 is substantially the same as the thermal conductivity of the barrier layers 130 has been described as an example. However, the example embodiments are not limited thereto, and in some example embodiments the thermal conductivity of the phase-change layers 121, 122, and 123 is greater than the thermal conductivity of the barrier layers 130.

The phase of the phase-change material of each of the plurality of phase-change layers 121, 122, and 123 of the phase-change material stack 120 may be reversibly changed by applying a current to each of the plurality of phase-change layers 121, 122, and 123. Thus, as described below, data may be stored through a multi-bit operation using variable resistance values of the phase-change material stack 120.

Figure 6:
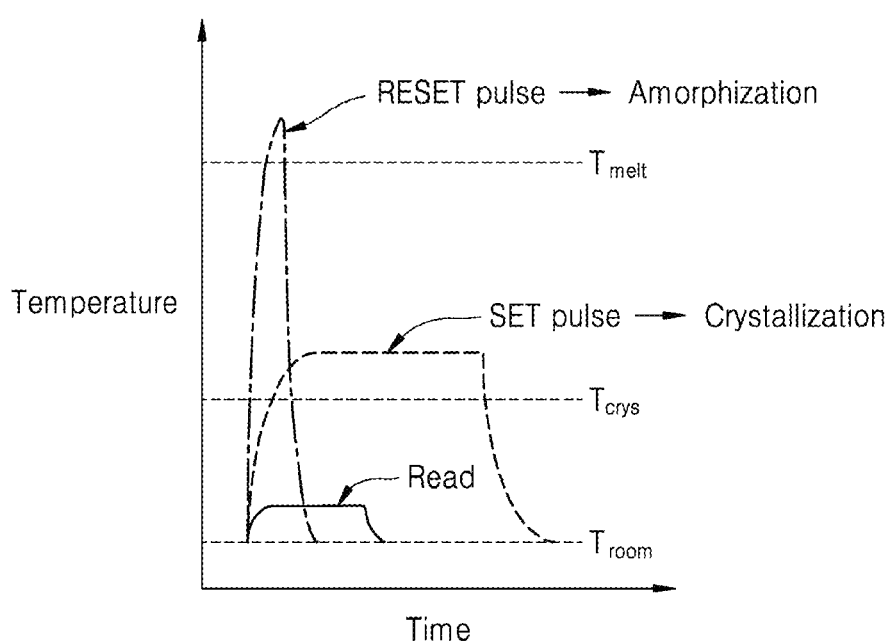
FIG. 6 illustrates examples of electrical pulses for controlling the phase of a phase-change material, according to some example embodiments.

FIG. 6 illustrates examples of electrical pulses for controlling the phase of a phase-change material of at least one phase-change layer of the phase-change material stack, according to some example embodiments. FIG. 6 illustrates time-variation of the temperature of the phase-change material based on applying an electrical pulse and/or signal to the phase-change material to heat the phase-change material over various periods of time.

Referring to FIG. 6, data may be stored in a phase-change layer by applying an electrical pulse to a phase-change material of the phase-change layer to heat the phase-change material to a temperature higher than the phase-change temperature (crystallization temperature or melting temperature) of the phase-change material. In a "SET operation" using a crystallization method, data may be stored in a phase-change material of a phase-change layer by heating the phase-change material to a temperature higher than the crystallization temperature of the phase-change material (which may be a temperature that is lower than the melting temperature of the phase-change material) to change the phase-change material from an amorphous high-resistance state to a crystalline low-resistance state. Furthermore, in a "RESET operation" using an amorphization method, data may be stored in a phase-change material of a phase-change layer by heating the phase-change material to a temperature higher than the melting temperature of the phase-change material (which is higher than the crystallization temperature) to change the phase-change material from a crystalline low-resistance state to an amorphous high-resistance state. In addition, information stored in a phase-change material may be read by measuring the resistance of the phase-change material, which may include applying an electrical signal to the phase-change material such that the temperature of the phase-change material remains below the crystallization temperature.

Figure 7:
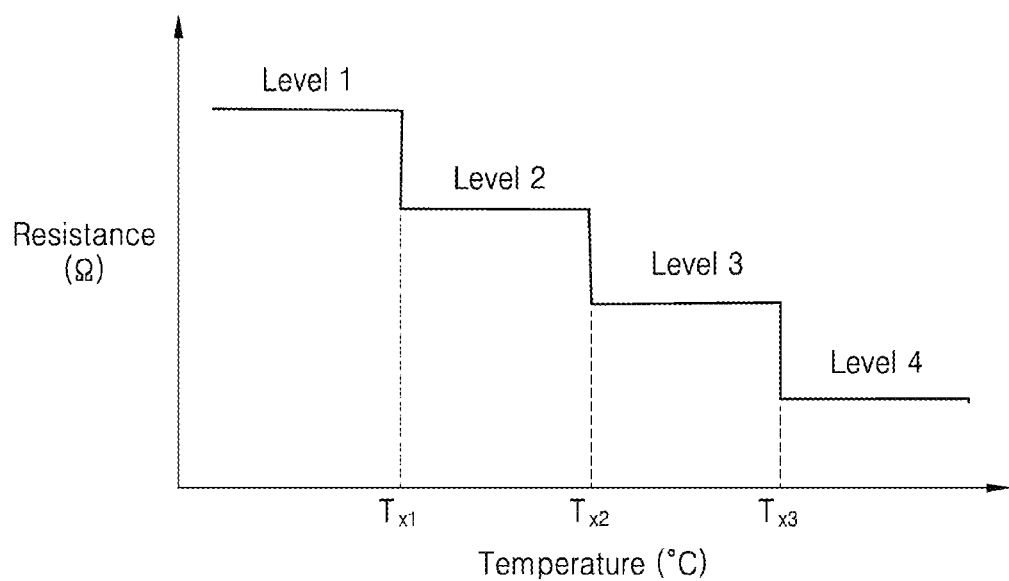
FIG. 7 is an example graph illustrating the resistance of the phase-change memory structure shown in FIG. 5, which varies according to the temperature of the phase-change memory structure, according to some example embodiments.

FIG. 7 is an example graph illustrating the resistance of the phase-change memory structure 100 shown in FIG. 5, which varies according to the temperature of the phase-change memory structure 100 (e.g., a temperature of the phase-change material stack 120, including one or more phase-change layers 121, 122, 123 thereof), according to some example embodiments. Data may be stored in the phase-change memory structure 100 shown in FIG. 5 through a "SET operation" using a crystallization method applied to one or more phase-change layers 121, 122, 123 of the phase-change memory structure 100. In some example embodiments, FIG. 7 illustrates a temperature of one or more phase-change layers 121, 122, 123 of the phase-change memory structure 100 and a corresponding resistance of the phase-change memory structure 100, according to some example embodiments.

Referring to FIG. 7, at a temperature lower than the first crystallization temperature $T_{x1}$, (e.g., in response to the temperature of the first, second, and third phase-change layers 121, 122, and 123 being lower than the first crystallization temperature $T_{x1}$), the first, second, and third phase-change layers 121, 122, and 123 are all in an amorphous state, and thus Level 1 (for example, a "00" state) having a first resistance value may be stored in the phase-change memory structure 100. In addition, at a temperature between the first crystallization temperature $T_{x1}$ and the second crystallization temperature $T_{x2}$ (e.g., in response to the temperature of the first, second, and third phase-change layers 121, 122, and 123 being between the first crystallization temperature $T_{x1}$ and the second crystallization temperature $T_{x2}$), the first phase-change layer 121 changes to a crystalline state, and the second and third phase-change layers 122 and 123 maintain the amorphous state, such that Level 2 (for example, a "01" state) having a second resistance value less than the first resistance value may be stored in the phase-change memory structure 100.

At a temperature between the second crystallization temperature $T_{x2}$ and the third crystallization temperature $T_{x3}$ (e.g., in response to the temperature of the first, second, and third phase-change layers 121, 122, and 123 being between the second crystallization temperature $T_{x2}$ and the third crystallization temperature $T_{x3}$), the first and second phase-change layers 121 and 122 change to the crystalline state, and the third phase-change layer 123 maintains the amorphous state, such that Level 3 (for example, a "10" state) having a third resistance value less than the second resistance value may be stored in the phase-change memory structure 100. In addition, at a temperature higher than the third crystallization temperature $T_{x3}$ (e.g., in response to the temperature of the first, second, and third phase-change layers 121, 122, and 123 being higher than the third crystallization temperature $T_{x3}$), all of the first, second, and third phase-change layers 121, 122, and 123 change to the crystalline state, such that Level 4 (for example, a "11" state) having a fourth resistance value less than the third resistance value may be stored in the phase-change memory structure 100. FIG. 7 illustrates an example in which the phase-change memory structure 100 implements a two-bit operation. However, this is merely a non-limiting example, and a multi-bit operation such as a three-or-more-bit operation may be implemented.

As described above, in some example embodiments, a multi-bit operation may be performed on the phase-change memory structure 100 by using resistance variations of each of the plurality of phase-change layers 121, 122, and 123 of the phase-change material stack 120. The case in which a phase-change material stack includes phase-change layers having three different thicknesses has been described. However, in a phase-change material stack, the number of phase-change layers having different thicknesses may be variously modified.

Figure 8:
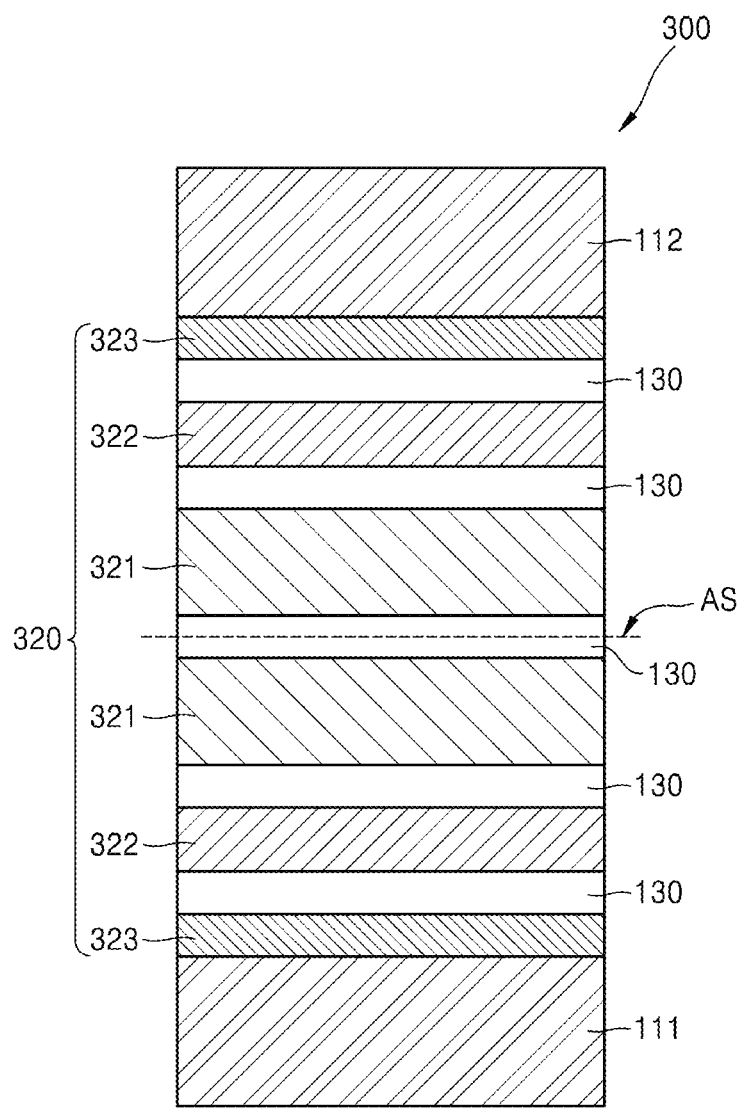
FIG. 8 is a cross-sectional view illustrating a phase-change memory structure according to some example embodiments.

FIG. 8 is a cross-sectional view illustrating a phase-change memory structure 300 according to some example embodiments. Hereinafter, differences from some example embodiments described above, including for example the example embodiments shown in FIG. 5, will be mainly described.

Referring to FIG. 8, a plurality of phase-change layers 321, 322, and 323 of a phase-change material stack 320 may be vertically symmetrical with respect to a central portion of the phase-change material stack 320. For example, first phase-change layers 321 may be symmetrically arranged in the central portion of the phase-change material stack 320 (e.g., the first phase-change layers 321 may have mirror symmetry or reflective symmetry around an axis of symmetry AS), second phase-change layers 322 may be symmetrically arranged above and below the first phase-change layers 321 (e.g., the second phase-change layers 322 may have mirror symmetry or reflective symmetry around an axis of symmetry AS), and third phase-change layers 323 may be symmetrically arranged above and below the second phase-change layers 322 (e.g., the third phase-change layers 323 may have mirror symmetry or reflective symmetry around an axis of symmetry AS).

The plurality of phase-change layers 321, 322, and 323 may be arranged such that the thicknesses of the plurality of phase-change layers 321, 322, and 323 may gradually increase and the crystallization temperatures of the plurality of phase-change layers 321, 322, and 323 may gradually decrease in a direction toward the central portion of the phase-change material stack 320. Therefore, the first phase-change layers 321 arranged adjacent to the center of the phase-change material stack 320 may be the thickest, and the third phase-change layers 323 arranged in outer portions of the phase-change material stack 320 may be the thinnest. Thermal conductivity of the phase-change layers 321, 322, and 323 may be substantially equal to or greater than that of the barrier layer 130.

Figure 9:
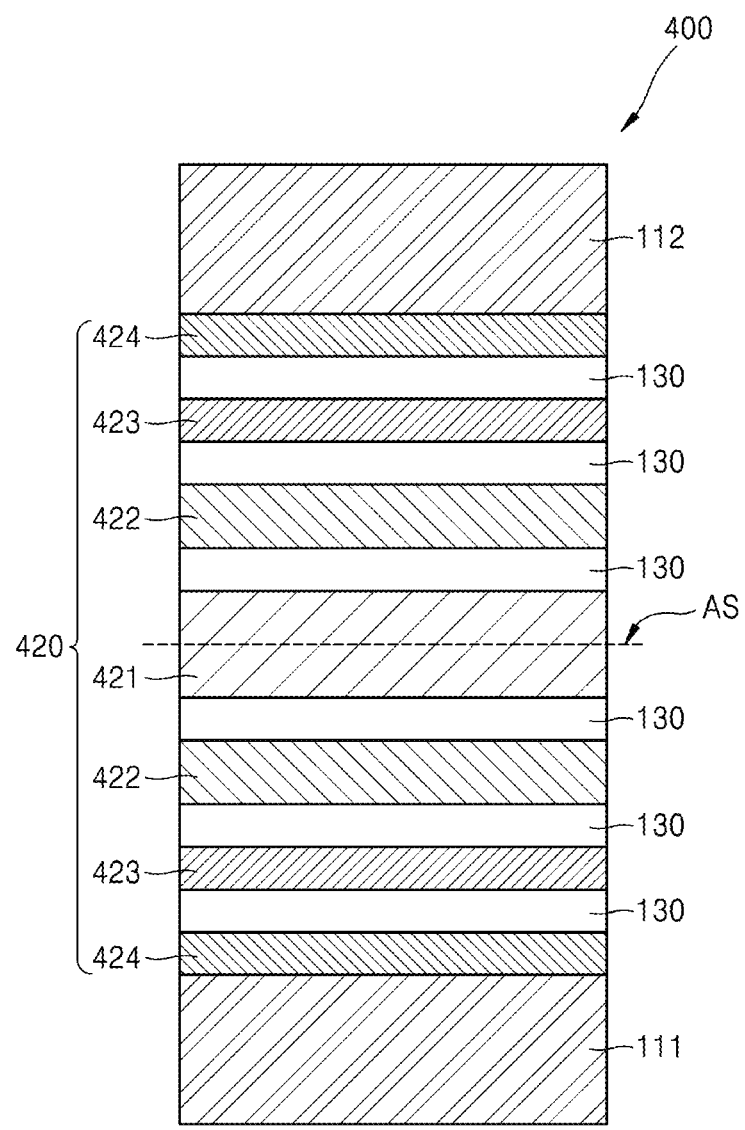
FIG. 9 is a cross-sectional view illustrating a phase-change memory structure according to some example embodiments.

FIG. 9 is a cross-sectional view illustrating a phase-change memory structure 400 according to some example embodiments. Hereinafter, differences from some example embodiments described above, including for example the example embodiments shown in FIG. 5 and/or FIG. 8, will be mainly described.

Referring to FIG. 9, a plurality of phase-change layers 421, 422, 423, and 424 of a phase-change material stack 420 may be vertically symmetrical with respect to a central portion of the phase-change material stack 420. A first phase-change layer 421 may be disposed in the central portion of the phase-change material stack 420, and second phase-change layers 422 may be symmetrically arranged above and below of the first phase-change layer 421 (e.g., the second phase-change layers 422 may have mirror symmetry or reflective symmetry around an axis of symmetry AS that extends through a center of the first phase-change layer 421). In addition, third phase-change layers 423 may be symmetrically arranged above and below the second phase-change layers 422 (e.g., the third phase-change layers 423 may have mirror symmetry or reflective symmetry around an axis of symmetry AS that extends through a center of the first phase-change layer 421), and fourth phase-change layers 424 may be symmetrically arranged above and below the third phase-change layers 423 (e.g., the fourth phase-change layers 424 may have mirror symmetry or reflective symmetry around an axis of symmetry AS that extends through a center of the first phase-change layer 421).

The plurality of phase-change layers 421, 422, 423, and 424 may be arranged such that the thicknesses of the plurality of phase-change layers 421, 422, 423, and 424 may gradually increase and the crystallization temperatures of the plurality of phase-change layers 421, 422, 423, and 424 may gradually decrease in a direction toward the central portion of the phase-change material stack 420. Therefore, the first phase-change layer 421 disposed adjacent to the center of the phase-change material stack 420, and thus the most proximate to the central portion of the phase-change material stack 420 among the plurality of phase-change layers 421, 422, 423, and 424, may be the thickest (e.g., have the greatest thickness) among the thicknesses of the plurality of phase-change layers 421, 422, 423, and 424. In addition, the fourth phase-change layers 424 arranged in outer portions of the phase-change material stack 420, and thus the most distant from the central portion of the phase-change material stack 420 among the plurality of phase-change layers 421, 422, 423, and 424, may be the thinnest (e.g., have the smallest thickness) among the thicknesses of the plurality of phase-change layers 421, 422, 423, and 424. However, example embodiments are not limited thereto, and adjacent phase-change layers may have the same thickness. For example, the fourth phase-change layers 424 may have the same thickness as the thickness of the third phase-change layers 423. In this way, when the thinnest third and fourth phase-change layer 423 and 424 having the same thickness are disposed adjacent to each other, the resistance variations between levels may be maintained at equal intervals.

In some example embodiments, including the example embodiments described above, the plurality of phase-change layers of the phase-change material stack include the same chalcogenide material. However, some of the plurality of phase-change layers of the phase-change material stack may include another chalcogenide material and thus may include different chalcogenide materials. Thermal conductivity of the phase-change layers 421, 422, 423, and 424 may be substantially equal to or greater than that of the barrier layer 130.

Figure 10:
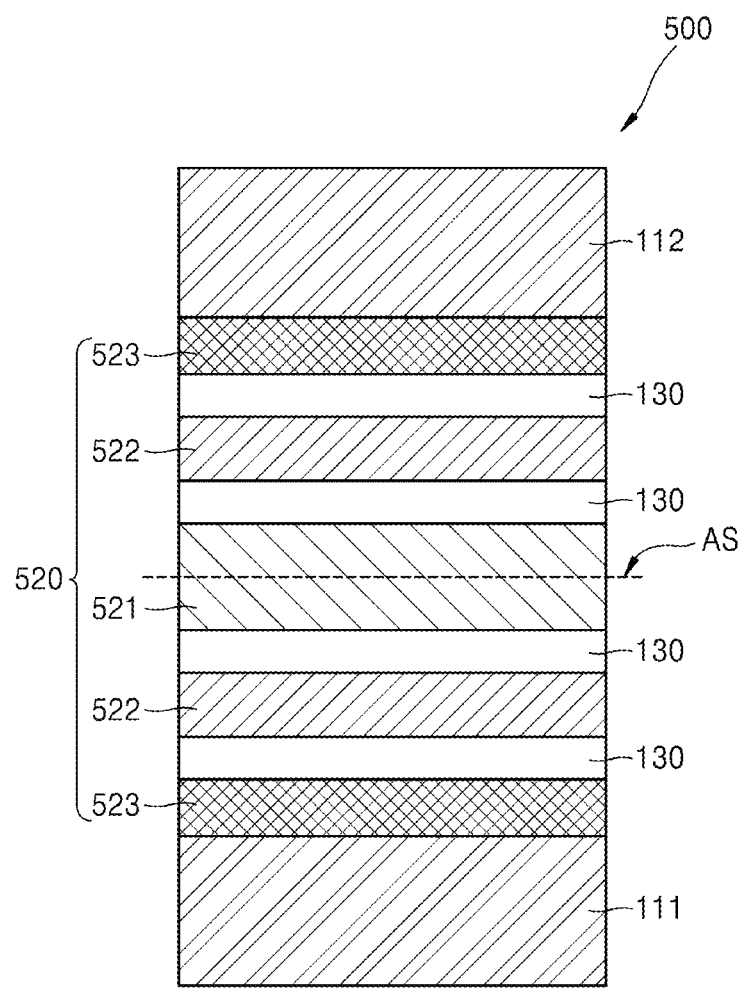
FIG. 10 is a cross-sectional view illustrating a phase-change memory structure according to some example embodiments.

FIG. 10 is a cross-sectional view illustrating a phase-change memory structure 500 according to some example embodiments. Hereinafter, differences from some example embodiments described above, including for example the example embodiments shown in FIGS. 5, 8, and/or 9, will be mainly described.

Referring to FIG. 10, a plurality of phase-change layers 521, 522, and 523 of a phase-change material stack 520 may be vertically symmetrical with respect to a central portion of the phase-change material stack 520 (e.g., may have mirror symmetry or reflective symmetry around an axis of symmetry AS extending through the central portion of the phase-change material stack 520). A first phase-change layer 521 may be disposed in the central portion of the phase-change material stack 520 (e.g., the axis of symmetry AS may extend through the first phase-change layer 521), second phase-change layers 522 may be symmetrically arranged above and below the first phase-change layer 521, third phase-change layers 523 may be symmetrically arranged above and below the second phase-change layers 522.

The plurality of phase-change layers 521, 522, and 523 may be arranged such that the crystallization temperatures of the plurality of phase-change layers 521, 522, and 523 may gradually decrease in a direction toward the central portion of the phase-change material stack 520. Therefore, the first phase-change layer 521 may have the lowest crystallization temperature, and the third phase-change layers 523 may have the highest crystallization temperature.

The first and second phase-change layers 521 and 522 may include the same chalcogenide material. Therefore, the first phase-change layer 521 disposed in the central portion of the phase-change material stack 520 may be thicker than the second phase-change layers 522. The third phase-change layers 523 may include a chalcogenide material different from the chalcogenide material included in the first and second phase-change layers 521 and 522. The third phase-change layers 523 may have a crystallization temperature higher than the crystallization temperature of the second phase-change layers 522. The third phase-change layers 523 may include a chalcogenide material having a certain thickness, and thus the third phase-change layers 523 may have a crystallization temperature higher than the crystallization temperature of the second phase-change layers 522. The third phase-change layers 523 may have a thickness different from the thicknesses of the first and second phase-change layers 521 and 522. However, example embodiments are not limited thereto, and the third phase-change layers 523 may have the same thickness as any one of the first or second phase-change layers 521 or 522. Thermal conductivity of the phase-change layers 521, 522, and 523 may be substantially equal to or greater than that of the barrier layer 130.

Figure 11:
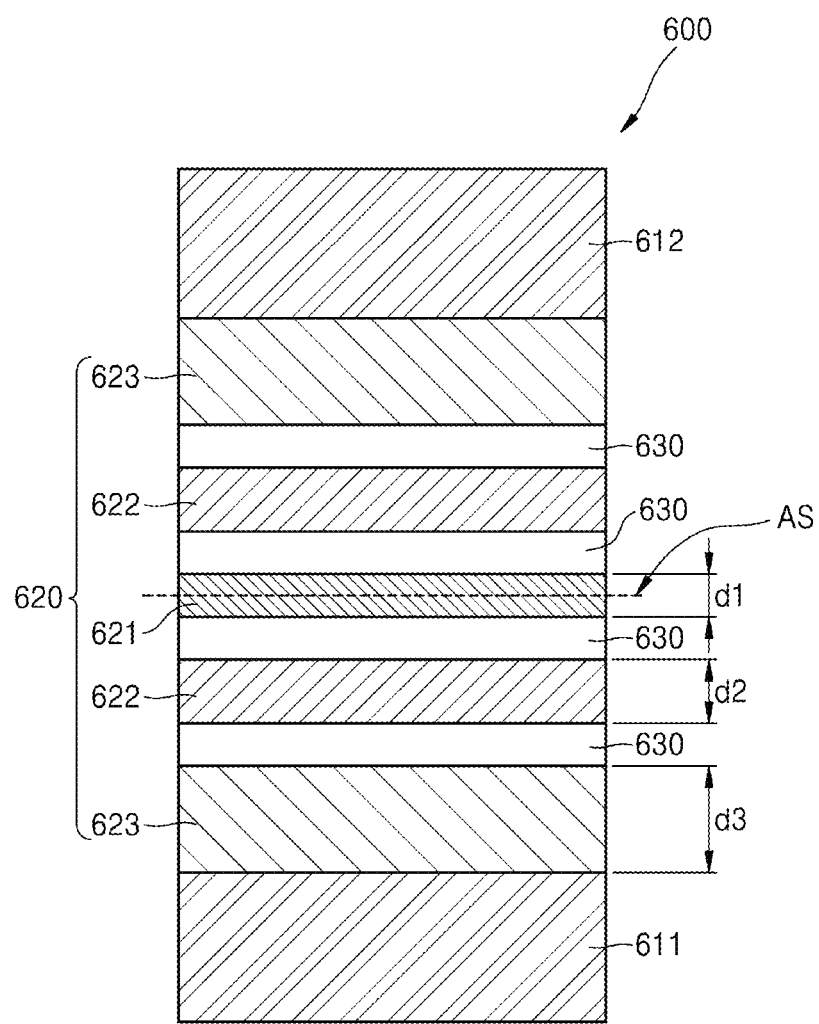
FIG. 11 is a cross-sectional view illustrating a phase-change memory structure according to some example embodiments.

FIG. 11 is a cross-sectional view illustrating a phase-change memory structure 600 according to some example embodiments.

Referring to FIG. 11, the phase-change memory structure 600 includes lower and upper electrodes 611 and 612, and a phase-change material stack 620 provided between the lower electrode 611 and the upper electrode 612. Here, the lower electrode 611 and the upper electrode 612 may be in contact with the phase-change material stack 620 with the same contact area.

The lower and upper electrodes 611 and 612 may each include a conductive material. For example, the conductive material may include a metal, a conductive metal oxide, a conductive metal nitride, or any combination thereof. The phase-change material stack 620 having a multi-layer structure is disposed between the lower electrode 611 and the upper electrode 612. The phase-change material stack 620 may include a plurality of phase-change layers 621, 622, and 623, and each of the plurality of phase-change layers 621, 622, 623 may include a phase-change material of which the phase changes according to temperatures.

Each of the plurality of phase-change layers 621, 622, and 623 may include a multi-component chalcogenide material having a crystallization temperature of about 100 degrees Celsius or higher. Here, the plurality of phase-change layers 621, 622, and 623 may include the same chalcogenide material. For example, the plurality of phase-change layers 621, 622, and 623 may include: at least one selected from Sb and Te; and at least one selected from Ge, Se, In, Al, Ti, Sc, Sr, Ga, Ag, Ca, P, and S. However, example embodiments are not limited thereto. In addition, the plurality of phase-change layers 621, 622, and 623 may further include, for example, a dopant material such as C, B, N, and O.

Barrier layers 630 may be provided between the plurality of phase-change layers 621, 622, and 623. The barrier layers 630 may include an electrically conductive material having low thermal conductivity. For example, the barrier layers 630 may include a non-oxide material having a thermal conductivity of about 1 W/mK or less. The barrier layers 630 may have a thickness of about 1 nm to about 10 nm. However, the barrier layers 630 are not limited thereto.

The plurality of phase-change layers 621, 622, and 623 of the phase-change material stack 620 may be vertically symmetrical with respect to a central portion of the phase-change material stack 620. FIG. 11 illustrates an example in which: a first phase-change layer 621 is disposed in the central portion of the phase-change material stack 620; second phase-change layers 622 are arranged above and below the first phase-change layer 621 about the first phase-change layer 621 such that the second phase-change layers 622 may be symmetrical with respect to the first phase-change layer 621; and third phase-change layers 623 are arranged above and below the second phase-change layers 622 such that the third phase-change layers 623 may be symmetrical with respect to the first phase-change layer 621.

The plurality of phase-change layers 621, 622, and 623 may have different thicknesses. At least one of the plurality of phase-change layers 621, 622, or 623 may have a thickness of about 10 nm or less. As described above, the melting temperature of a chalcogenide-based phase-change material may vary as the thickness of the chalcogenide-based phase-change material varies within a thickness range of about 10 nm or less. Therefore, when the plurality of phase-change layers 621, 622, and 623 have different thicknesses, the plurality of phase-change layers 621, 622, and 623 may have different melting temperatures.

One of the plurality of phase-change layers 621, 622, or 623, which has the lowest melting temperature, may be disposed in a region to be heated to the highest temperature among regions of the phase-change material stack 620 to be heated by applying a current through the lower and upper electrodes 611 and 612. However, example embodiments are not limited thereto.

When the thermal conductivity of the phase-change material stack 620 is greater than the thermal conductivity of the barrier layers 630, the central portion of the phase-change material stack 620 may have the highest temperature. In this case, the first phase-change layer 621 having the lowest melting temperature among the plurality of phase-change layers 621, 122 and 123 may be disposed in the central portion of the phase-change material stack 620, and the third phase-change layers 123 having the highest melting temperature among the plurality of phase-change layers 621, 622, and 623 may be arranged in outer portions of the phase-change material stack 620.

The melting temperature of a chalcogenide-based phase-change material may decrease as the thickness of the chalcogenide-based phase-change material gradually decreases within a range of about 10 nm or less (e.g., about 1 nm to about 10 nm). Therefore, the plurality of phase-change layers 621, 622, and 623 may be arranged such that the thicknesses of the plurality of phase-change layers 621, 622, and 623 may gradually decrease and the melting temperatures of the plurality of phase-change layers 621, 622, and 623 may gradually decrease in a direction toward the central portion of the phase-change material stack 620. For example, respective thicknesses of the phase-change layers 621, 622, and 623 may be proportional (e.g., directly proportional according to a fixed coefficient of proportionality such as 0.1, 0.5, 1, 1.5, etc.) to the respective distances of the phase-change layers 621, 622, and 623 from the central portion of the phase-change material stack 620, and respective phase-change temperatures, for example melting temperatures, of the phase-change layers 621, 622, and 623 may be proportional (e.g., directly proportional according to a fixed coefficient of proportionality such as 0.1, 0.5, 1, 1.5, etc.) to respective distances of the phase-change layers 621, 622, and 623 from the central portion of the phase-change material stack 620. Here, the thinnest phase-change layer of the plurality of phase-change layers 621, 622, and 623 may have a thickness of about 10 nm or less (for example, about 5 nm or less).

The first phase-change layer 621, which is the thinnest among the plurality of phase-change layers 621, 622, and 623, may be disposed in the central portion of the phase-change material stack 620, and the third phase-change layers 623, which are the thickest among the plurality of phase-change layers 621, 622, and 623, may be disposed in the outer portions of the phase-change material stack 620. The first phase-change layer 621 may have a thickness of about 10 nm or less (for example, about 5 nm or less). The third phase-change layer 623 may have a thickness of about 10 nm or more or a thickness of 10 nm or less.

FIG. 11 illustrates an example in which: the first phase-change layer 621 disposed in the central portion of the phase-change material stack 620 has a first thickness d1 and a first melting temperature $T_{m1}$; the second phase-change layers 622 respectively provided above and below the first phase-change layer 621 have a second thickness d2 greater than the first thickness d1 (d2>d1) and a second melting temperature $T_{m2}$ higher than the first melting temperature $T_{m1}$ ($T_{m2}>T_{m1}$); and the third phase-change layers 623 provided respectively above and below the second phase-change layers 622 have a third thickness d3 greater than the second thickness d2 (d3>d2) and a third melting temperature $T_{m3}$ higher than the second melting temperature $T_{m2}$ ($T_{m3}>T_{m2}$).

In the above description, the case in which the thermal conductivity of the phase-change layers 621, 622, and 623 is greater than the thermal conductivity of the barrier layers 630 has been described as an example. However, example embodiments are not limited thereto, and in some example embodiments the thermal conductivity of the phase-change layers 621, 622, and 623 is substantially the same as the thermal conductivity of the barrier layers 630.

The phase of the phase-change material of each of the plurality of phase-change layers 621, 622, and 623 of the phase-change material stack 620 may be reversibly changed by applying a current to each of the plurality of phase-change layers 621, 622, and 623. Thus, data may be stored through a multi-bit operation using variable resistance values of the phase-change material stack 620.

Figure 12:
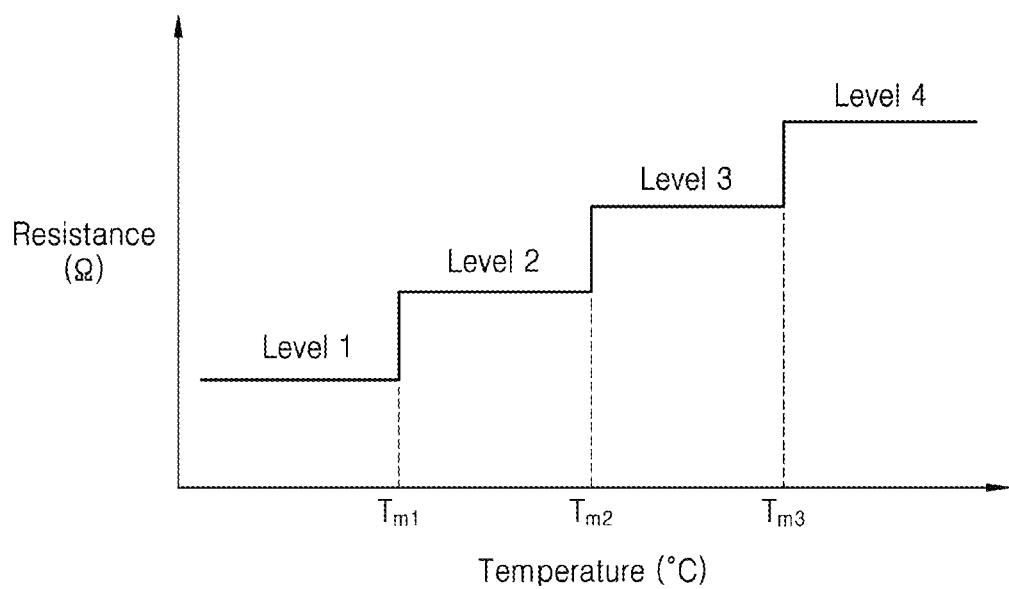
FIG. 12 is an example graph illustrating the resistance of the phase-change memory structure shown in FIG. 11, which varies according to the temperature of the phase-change memory structure, according to some example embodiments.

FIG. 12 is an example graph illustrating the resistance of the phase-change memory structure 600 shown in FIG. 11, which varies according to the temperature of the phase-change memory structure 600, according to some example embodiments. Data may be stored in the phase-change memory structure 600 shown in FIG. 11 through a "RESET operation" using an amorphization method.

Referring to FIG. 12, at a temperature lower than the first melting temperature $T_{m1}$, the first, second, and third phase-change layers 621, 622, and 623 are all in a crystalline state, and thus Level 1 (for example, a "11" state) having a first resistance value may be stored. In addition, at a temperature between the first melting temperature $T_{m1}$ and the second melting temperature $T_{m2}$, the first phase-change layer 621 changes to an amorphous state, and the second and third phase-change layers 622 and 623 maintain the crystalline state, such that Level 2 (for example, a "10" state) having a second resistance value greater than the first resistance value may be stored.

At a temperature between the second melting temperature $T_{m2}$ and the third melting temperature $T_{m3}$, the first and second phase-change layers 621 and 622 change to the amorphous state, and the third phase-change layer 623 maintains the crystalline state, such that Level 3 (for example, a "01" state) having a third resistance value greater than the second resistance value may be stored. In addition, at a temperature higher than the third melting temperature $T_{m3}$, all of the first, second, and third phase-change layers 621, 622, and 623 change to the amorphous state, such that Level 4 (for example, a "00" state) having a fourth resistance value greater than the third resistance value may be stored. FIG. 12 illustrates an example in which the phase-change memory structure 600 implements a two-bit operation. However, this is merely a non-limiting example, and a multi-bit operation such as a three-or-more-bit operation may be implemented.

As described above, in some example embodiments, a multi-bit operation may be performed on the phase-change memory structure 600 by using resistance variations of each of the plurality of phase-change layers 621, 622, and 623 of the phase-change material stack 620. The case in which a phase-change material stack includes phase-change layers having three different thicknesses has been described. However, in a phase-change material stack, the number of phase-change layers having different thicknesses may be variously modified.

Figure 13:
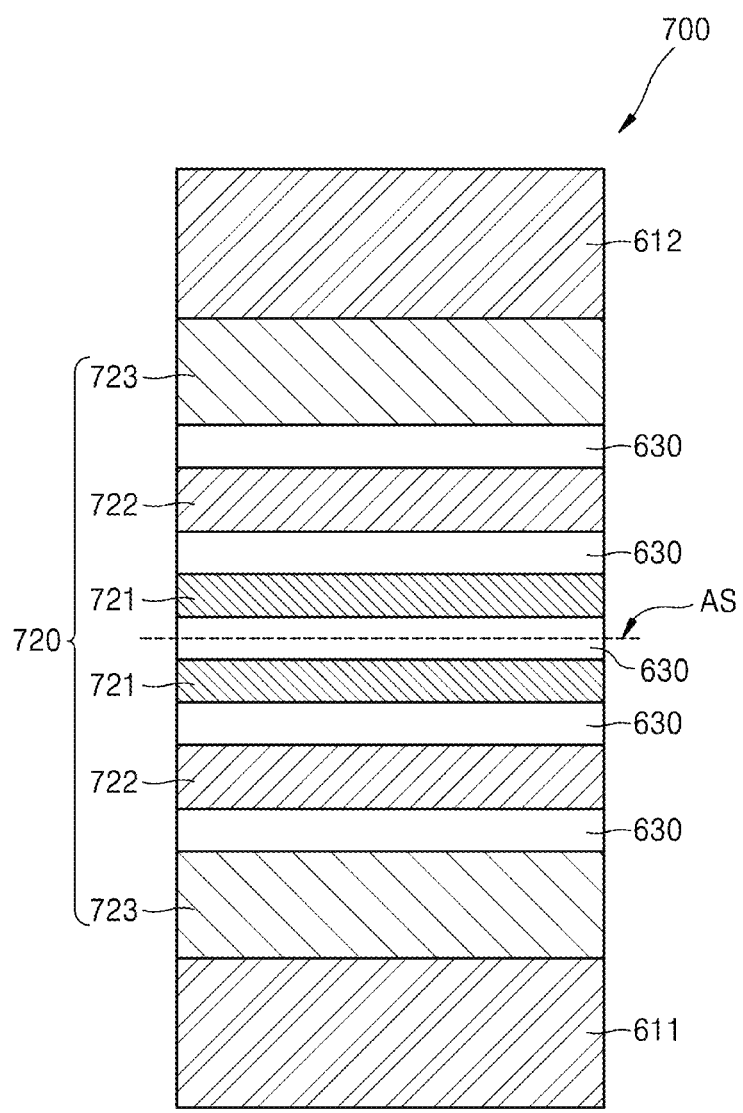
FIG. 13 is a cross-sectional view illustrating a phase-change memory structure according to some example embodiments.

FIG. 13 is a cross-sectional view illustrating a phase-change memory structure 700 according to some example embodiments. Hereinafter, differences from some example embodiments described above, including for example the example embodiments shown in FIGS. 5, 8, 9, 10, and/or 11, will be mainly described.

Referring to FIG. 13, a plurality of phase-change layers 721, 722, and 723 of a phase-change material stack 720 may be vertically symmetrical with respect to a central portion of the phase-change material stack 720. For example, first phase-change layers 721 may be symmetrically arranged in the central portion of the phase-change material stack 720, second phase-change layers 722 may be symmetrically arranged above and below the first phase-change layers 721, and third phase-change layers 723 may be symmetrically arranged above and below the second phase-change layers 722.

The plurality of phase-change layers 721, 722, and 723 may be arranged such that the thicknesses of the plurality of phase-change layers 721, 722, and 723 may gradually decrease and the melting temperatures of the plurality of phase-change layers 721, 722, and 723 may gradually decrease in a direction toward the central portion of the phase-change material stack 720. Therefore, the first phase-change layers 721 arranged adjacent to the center of the phase-change material stack 720 may be the thinnest, and the third phase-change layers 723 arranged in outer portions of the phase-change material stack 720 may be the thickest. In the current embodiments, a plurality of first phase-change layers 721 having the smallest thickness are arranged in the central portion of the phase-change material stack 720, and thus resistance variations between levels may be maintained at equal intervals.

In some example embodiments described above, the plurality of phase-change layers of the phase-change material stack include the same chalcogenide material. However, some of the plurality of phase-change layers of the phase-change material stack may include another chalcogenide material. Thermal conductivity of the phase-change layers 721, 722, and 723 may be greater than that of the barrier layer 630 or may be substantially equal to the thermal conductivity of the barrier layer 630.

Figure 14:
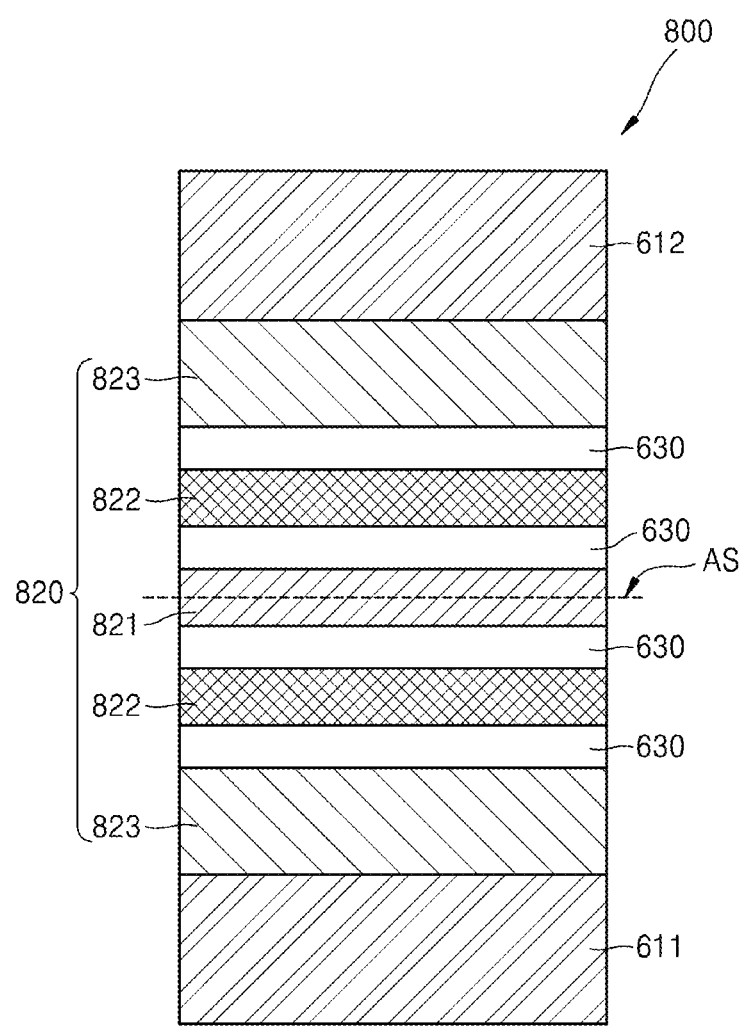
FIG. 14 is a cross-sectional view illustrating a phase-change memory structure according to some example embodiments.

FIG. 14 is a cross-sectional view illustrating a phase-change memory structure 800 according to some example embodiments. Hereinafter, differences from some example embodiments described above, including for example the example embodiments shown in FIGS. 5, 8, 9, 10, 11, and/or 13, will be mainly described.

Referring to FIG. 14, a plurality of phase-change layers 821, 822, and 823 of a phase-change material stack 820 may be vertically symmetrical with respect to a central portion of the phase-change material stack 820. A first phase-change layer 821 may be disposed in the central portion of the phase-change material stack 820, second phase-change layers 822 may be symmetrically arranged above and below the first phase-change layer 821, third phase-change layers 823 may be symmetrically arranged above and below the second phase-change layers 822.

The plurality of phase-change layers 821, 822, and 823 may be arranged such that the melting temperatures of the plurality of phase-change layers 821, 822, and 823 may gradually decrease in a direction toward the central portion of the phase-change material stack 820. Therefore, the first phase-change layer 821 may have the lowest melting temperature, and the third phase-change layers 823 may have the highest melting temperature.

The first and third phase-change layers 821 and 823 may include the same chalcogenide material. Therefore, the first phase-change layer 821 disposed in the central portion of the phase-change material stack 820 may be thinner than the third phase-change layers 823. The second phase-change layers 822 may include a chalcogenide material different from the chalcogenide material included in the first and third phase-change layers 821 and 823. The second phase-change layers 822 may have a melting temperature, which is higher than the melting temperature of the first phase-change layer 821 and lower than the melting temperature of the third phase-change layers 823. The second phase-change layers 822 may include a chalcogenide material having a certain thickness. The second phase-change layers 822 may have a thickness different from the thicknesses of the first and third phase-change layers 821 and 823. However, example embodiments are not limited thereto, and the second phase-change layers 822 may have the same thickness as any one of the first or third phase-change layers 821 or 823. Thermal conductivity of the phase-change layers 821, 822, and 823 may be greater than that of the barrier layer 630 or may be substantially equal to the thermal conductivity of the barrier layer 630.

Referring to FIGS. 5, 8, 9, 10, 11, 13, and 14, a phase-change material stack of a phase-change memory device may include an asymmetrical vertical arrangement of phase-change layers, for example including a plurality of phase-change layers 121, 122, 123 which are vertically asymmetrical with respect to a central portion of the phase-change material stack 120.

Referring to FIGS. 4, 5, 8, 9, 10, 11, 13, and 14, a phase-change memory device 1000 according to some example embodiments may include one or more memory cells MC that include a selector 200 and a phase-change memory structure that includes an internal structure of any of the phase-change memory structures 100, 300, 400, 500, 600, 700, and/or 800 according to any of the example embodiments. In some example embodiments, the phase-change memory device 1000 may include memory cells MC that have respective phase-change memory structures that have a same internal structure (e.g., same arrangement, quantity, size, shape, and/or composition of layers therein), for example separate memory cells MC of the phase-change memory device 1000 may be same ones of the phase-change memory structures 100, 300, 400, 500, 600, 700, and/or 800 according to any of the example embodiments. In some example embodiments, the phase-change memory device 1000 may include memory cells MC that have respective phase-change memory structures that have different internal structures (e.g., different arrangement, quantity, size, shape, and/or composition of layers therein), for example separate memory cells MC of the phase-change memory device 1000 may be different ones of the phase-change memory structures 100, 300, 400, 500, 600, 700, and/or 800 according to any of the example embodiments. In some example embodiments, a phase-change memory device 1000 that includes memory cells MC that have respective phase-change memory structures that have different internal structures may have improved resistance to malfunction due to common defects among the memory cells, as memory cells having different internal structures of phase-change memory structures may have a reduced likelihood of exhibiting a common defect (e.g., common process or manufacturing defect) due to having different internal structures.

The phase-change memory device 1000 described above may be used in various electronic devices for storing data.

Figure 15:
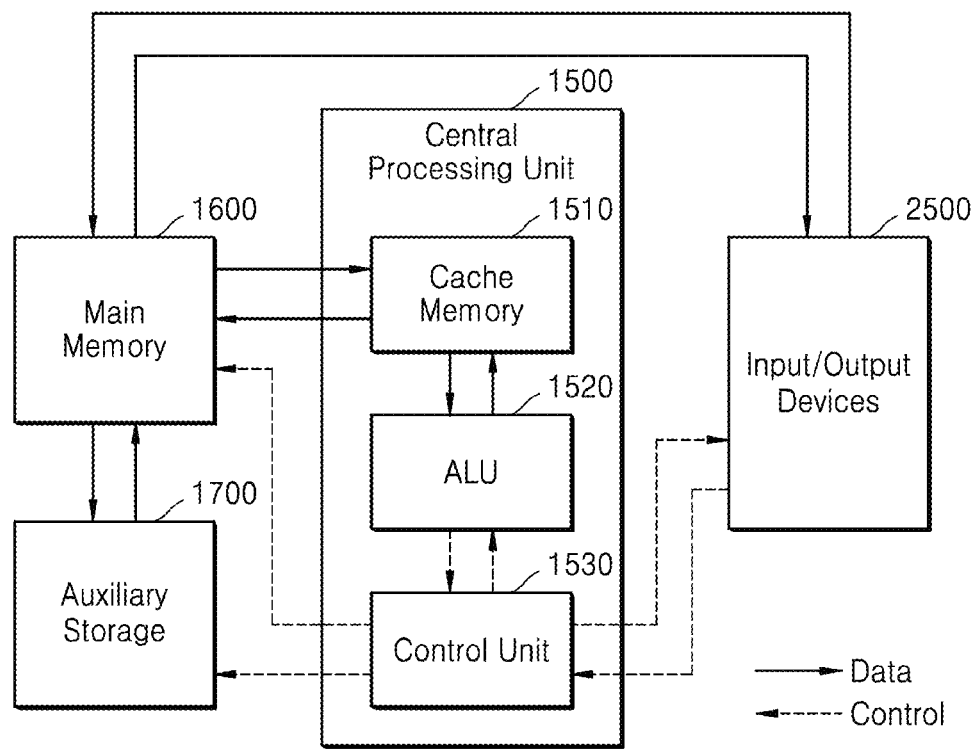
FIG. 15 is a conceptual view schematically illustrating a device architecture applicable to an electronic device according to some example embodiments.

FIG. 15 is a conceptual view schematically illustrating a device architecture applicable to an electronic device according to some example embodiments.

Referring to FIG. 15, a cache memory 1510, an arithmetic logic unit (ALU) 1520, and a control unit 1530 may form a central processing unit (CPU) 1500. The cache memory 1510 may include a static random access memory (SRAM). A main memory 1600 and an auxiliary storage 1700 may be provided separately from the CPU 1500. The main memory 1600 may include a dynamic random access memory (DRAM) device, and the auxiliary storage 1700 may include the phase-change memory device 1000. In some example embodiments, the cache memory 1510, the main memory 1600, and/or the auxiliary storage 1700 may include one or more phase-change memory devices 1000 according to any of the example embodiments. In some example embodiments, the device architecture may be implemented in the form in which unit computing devices and unit memory devices are adjacent to each other on one chip without any distinction between sub-units.

As shown, the device architecture may include one or more input/output devices 2500 which may be include one or more wired or wireless communication interfaces which may be communicatively coupled to one or more of the main memory 1600, the CPU 1500, the control unit 1530, the auxiliary storage 1700, or the like.

As described herein, any devices, electronic devices, modules, units, circuits, and/or portions thereof according to any of the example embodiments, and/or any portions thereof (including, without limitation, the CPU 1500, the cache memory 1510, the arithmetic logic unit (ALU) 1520, the control unit 1530, the main memory 1600, the auxiliary storage 1700, the one or more input/output devices 2500, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., a CPU) configured to execute the program of instructions to implement the functionality and/or methods performed by some or all of any devices, electronic devices, modules, units, circuits, and/or portions thereof, according to any of the example embodiments, including any of the methods according to any of the example embodiments.

Any of the memories described herein may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

As described above, according to the one or more of the above embodiments, a phase-change material stack includes a plurality of phase-change layers having different thicknesses, and the plurality of phase-change layers may have different phase change temperatures (crystallization temperatures or melting temperatures). Therefore, a multi-bit operation may be implemented using resistance variations caused by phase changes of the plurality of phase-change layers of the phase-change material stack. In addition, data may be stored not only through a "SET operation" using a crystallization method, but also through a "RESET operation" using an amorphization method. Owing to this, two-bit, three-bit, four-bit, or five-or-more-bit operations may be implemented, and thus large-capacity phase-change memory devices, for example, terabyte (TB)-level phase-change memory devices, may be provided. Furthermore, the phase-change memory device of some example embodiments may be used for artificial-intelligence calculations such as neuromorphic computing and in-memory computing. While embodiments have been described, some example embodiments are merely examples, and it will be understood by those of ordinary skill in the art that various modifications may be made in some example embodiments.

It should be understood that example embodiments described herein should be considered in a descriptive sense only and not for purposes of limitation. Descriptions of features or aspects within each example embodiment should typically be considered as available for other similar features or aspects in other example embodiments. While some embodiments have been described with reference to the figures, it will be understood by those of ordinary skill in the art that various changes in form and details may be made therein without departing from the spirit and scope as defined by the following claims.

What is claimed is:

1. A phase-change memory structure, comprising:
 a lower electrode and an upper electrode, the lower electrode and the upper electrode spaced apart from each other; and
 a phase-change material stack between the lower electrode and the upper electrode, the phase-change material stack including a plurality of phase-change layers, at least two phase-change layers of the plurality of phase-change layers having different phase-change temperatures, and a plurality of barrier layers between the plurality of phase-change layers,
 wherein the at least two phase-change layers of the plurality of phase-change layers have different thicknesses.

2. The phase-change memory structure of claim 1, wherein a contact area between the lower electrode and the phase-change material stack is identical in size to a contact area between the upper electrode and the phase-change material stack.

3. The phase-change memory structure of claim 1, wherein at least one of the plurality of phase-change layers has a thickness of about 0.01 nm to about 10 nm.

4. The phase-change memory structure of claim 1, wherein each phase-change layer of the plurality of phase-change layers comprises a multi-component chalcogenide material having a crystallization temperature of about 100 degrees Celsius to about 3000 degrees Celsius.

5. The phase-change memory structure of claim 1, wherein each barrier layer of the plurality of barrier layers comprises a non-oxide material having a thermal conductivity of about 0.001 W/mK to about 1 W/mK.

6. The phase-change memory structure of claim 1, wherein the plurality of phase-change layers are vertically symmetrical with respect to a central portion of the phase-change material stack.

7. The phase-change memory structure of claim 6, wherein respective phase-change temperatures of the plurality of phase-change layers are proportional to respective distances of the plurality of phase-change layers from the central portion of the phase-change material stack.

8. The phase-change memory structure of claim 7, wherein the respective phase-change temperatures of the plurality of phase-change layers are respective crystallization temperatures of the plurality of phase-change layers, and respective thicknesses of the plurality of phase-change layers are inversely proportional to the respective distances of the plurality of phase-change layers from the central portion of the phase-change material stack.

9. The phase-change memory structure of claim 8, wherein a thermal conductivity of each phase-change layer of the plurality of phase-change layers is equal to or greater than a thermal conductivity of each barrier layer of the plurality of barrier layers.

10. The phase-change memory structure of claim 8, wherein the phase-change memory structure is configured to implement a multi-bit operation based on crystallization of each phase-change layer of the plurality of phase-change layers.

11. The phase-change memory structure of claim 7, wherein
the respective phase-change temperatures of the plurality of phase-change layers are respective melting temperatures of the plurality of phase-change layers, and
respective thicknesses of the plurality of phase-change layers are proportional to the respective distances of the plurality of phase-change layers from the central portion of the phase-change material stack.

12. The phase-change memory structure of claim 11, wherein a thermal conductivity of each phase-change layer of the plurality of phase-change layers is greater than or equal to a thermal conductivity of each barrier layer of the plurality of barrier layers.

13. The phase-change memory structure of claim 11, wherein the phase-change memory structure is configured to implement a multi-bit operation based on amorphization of each phase-change layer of the plurality of phase-change layers.

14. A phase-change memory device, comprising:
a plurality of memory cells,
wherein each memory cell of the plurality of memory cells includes a phase-change memory structure and a selector, the phase-change memory structure and the selector connected in series to each other,
wherein the phase-change memory structure includes
a lower electrode and an upper electrode, the lower electrode and the upper electrode spaced apart from each other, and
a phase-change material stack between the lower electrode and the upper electrode, the phase-change material stack including a plurality of phase-change layers, at least two phase-change layers of the plurality of phase-change layers having different phase-change temperatures, and a plurality of barrier layers between the plurality of phase-change layers, and
wherein the at least two phase-change layers of the plurality of phase-change layers have different thicknesses.

15. The phase-change memory device of claim 14, wherein the phase-change memory device has a three-dimensional cross-point structure.

16. The phase-change memory device of claim 14, wherein a contact area between the lower electrode and the phase-change material stack is identical in size to a contact area between the upper electrode and the phase-change material stack, and at least one of the plurality of phase-change layers has a thickness of 10 nm or less.

17. The phase-change memory device of claim 14, wherein
the plurality of phase-change layers are vertically symmetrical with respect to a central portion of the phase-change material stack, and
respective phase-change temperatures of the plurality of phase-change layers are proportional to respective distances of the plurality of phase-change layers from the central portion of the phase-change material stack.

18. The phase-change memory device of claim 17, wherein
the respective phase-change temperatures of the plurality of phase-change layers are crystallization temperatures of the plurality of phase-change layers, and
respective thicknesses of the plurality of phase-change layers are inversely proportional to the respective distances of the plurality of phase-change layers from the central portion of the phase-change material stack.

19. The phase-change memory device of claim 17, wherein
the respective phase-change temperatures of the plurality of phase-change layers are melting temperatures of the plurality of phase-change layers, and
respective thicknesses of the plurality of phase-change layers are proportional to the respective distances of the plurality of phase-change layers from the central portion of the phase-change material stack.

20. An electronic device comprising the phase-change memory device of claim 14.

* * * * *